United States Patent
Yu et al.

(10) Patent No.: US 12,130,085 B2
(45) Date of Patent: Oct. 29, 2024

(54) MANUFACTURING METHOD FOR VAPOR CHAMBER, VAPOR CHAMBER AND MIDDLE FRAME VAPOR CHAMBER

(71) Applicant: DONGGUAN LINGJIE PRECISION MACHINING TECHNOLOGY CO., LTD., Guangdong (CN)

(72) Inventors: Quanyao Yu, Guangdong (CN); Pingping Liang, Guangdong (CN); Xuehua Li, Guangdong (CN); Guang Chen, Guangdong (CN)

(73) Assignee: DONGGUAN LINGJIE PRECISION MACHINING TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/026,299

(22) PCT Filed: Jan. 28, 2021

(86) PCT No.: PCT/CN2021/074018
§ 371 (c)(1),
(2) Date: Mar. 14, 2023

(87) PCT Pub. No.: WO2022/147861
PCT Pub. Date: Jul. 14, 2022

(65) Prior Publication Data
US 2023/0366632 A1 Nov. 16, 2023

(30) Foreign Application Priority Data

Jan. 11, 2021 (CN) .......................... 202110033052.9

(51) Int. Cl.
*F28D 15/02* (2006.01)

(52) U.S. Cl.
CPC ...... *F28D 15/0283* (2013.01); *F28F 2225/02* (2013.01); *F28F 2230/00* (2013.01); *F28F 2275/06* (2013.01)

(58) Field of Classification Search
CPC .. H05K 7/20336; H04M 1/02; H04M 1/0202; H01L 21/4882; H01L 23/427;
(Continued)

(56) References Cited

FOREIGN PATENT DOCUMENTS

| CN | 102506597 A | 6/2012 |
|---|---|---|
| CN | 107764116 A | 3/2018 |

(Continued)

OTHER PUBLICATIONS

International Search Report of International Application No. PCT/CN2021/074018, mailed May 28, 2021, 5 pages,.

(Continued)

*Primary Examiner* — Moshe Wilensky
(74) *Attorney, Agent, or Firm* — Quarles & Brady LLP

(57) ABSTRACT

A manufacturing method for a vapor chamber, a vapor chamber and a middle frame vapor chamber are disclosed. The manufacturing method for a vapor chamber includes preparing different raw materials for various parts of the vapor chamber, and machining and molding the various parts according to predetermined shapes of the various parts by using corresponding raw materials, assembling the machined and molded various parts of the vapor chamber, and welding and sealing the assembled various parts of the vapor chamber, performing a surface heat treatment on the vapor chamber, performing a passivating treatment on the vapor chamber, assembling the vapor chamber, injecting water into the vapor chamber assembled with the liquid injection pipe, vacuumizing the vapor chamber injected with
(Continued)

water, performing a sealing treatment on the vacuumized vapor chamber, and welding the vapor chamber with a reinforcing rib.

3 Claims, 4 Drawing Sheets

(58) Field of Classification Search
CPC ........ F28F 21/083; F28F 3/12; F28F 2225/02; F28F 2230/00; F28F 2275/06
See application file for complete search history.

(56) References Cited

FOREIGN PATENT DOCUMENTS

| | | | |
|---|---|---|---|
| CN | 109341393 | A | 2/2019 |
| CN | 209643138 | U | 11/2019 |
| CN | 110966880 | A | 4/2020 |
| CN | 111543798 | A | 8/2020 |
| CN | 112077547 | A | 12/2020 |
| CN | 112087920 | A | 12/2020 |
| TW | 201940829 | A | 10/2019 |
| WO | 2019056506 | A1 | 3/2019 |

OTHER PUBLICATIONS

Written Opinion of International Application No. PCT/CN2021/074018, mailed May 28, 2021, 5 pages.
First Office Action of Chinese Application No. 202110033052.9, dated Aug. 31, 2021, 14 pages.
Second Office Action of Chinese Application No. 202110033052.9, dated Nov. 25, 2021, 12 pages.

MANUFACTURING METHOD FOR VAPOR CHAMBER, VAPOR CHAMBER AND MIDDLE FRAME VAPOR CHAMBER

CROSS-REFERENCE TO RELATED APPLICATION

This application is a national stage filing under 35 U.S.C. § 371 of international application number PCT/CN2021/074018, filed on Jan. 28, 2021, which claims priority to Chinese patent application No. 202110033052.9 filed on Jan. 11, 2021. The contents of these applications are incorporated herein by reference in their entirety.

TECHNICAL FIELD

The disclosure relates to the technical field of heat dissipation, and particularly to a manufacturing method for a vapor chamber, a vapor chamber and a middle frame vapor chamber.

BACKGROUND

In related arts, electronic products, such as mobile phones, are becoming thinner and lighter, leaving less and less assembly space for components. Therefore, vapor chamber, as an application hotspot of heat dissipation technology, is being applied to more types of mobile phones. According to existing technologies, the vapor chamber subjected to a heat treatment has greatly weakened material strength and lacks mechanical strength, thus being greatly limited in application. In addition, existing vapor chambers are all covered on electronic components in a traditional middle frame, and only have a heat dissipation function, thus being relatively simple in function.

SUMMARY

The disclosure aims to solve at least one of the technical problems in the existing technology. Therefore, the disclosure provides a manufacturing method for a vapor chamber, which has a good anti-aging performance, and has a heat dissipation effect and a high mechanical strength at the same time, so that the vapor chamber has a supporting effect when electronic components are mounted, thus being multi-functional.

The disclosure further provides a vapor chamber manufactured by the manufacturing method for a vapor chamber above.

The disclosure further provides a middle frame vapor chamber having the vapor chamber above.

A manufacturing method for a vapor chamber according to an embodiment in a first aspect of the disclosure includes:
preparing different raw materials for various parts of the vapor chamber, and machining and molding the various parts according to predetermined shapes of the various parts by using corresponding raw materials;
assembling the machined and molded various parts of the vapor chamber, and welding and sealing the assembled various parts of the vapor chamber;
performing a surface heat treatment on the vapor chamber after welding and sealing;
performing a passivating treatment on the vapor chamber subjected to the surface heat treatment;
assembling the vapor chamber subjected to the passivating treatment with a liquid injection pipe;
injecting water into the vapor chamber assembled with the liquid injection pipe;
vacuumizing the vapor chamber injected with water;
performing a sealing treatment on the vacuumized vapor chamber; and
welding the vapor chamber subjected to the sealing treatment with a reinforcing rib.

The manufacturing method for a vapor chamber according to an embodiment of the disclosure has at least the following beneficial effects. The vapor chamber does not react with water by the surface heat treatment, so that an anti-aging performance of the vapor chamber is effectively improved. In addition, the manufacturing method for a vapor chamber in the disclosure enhances an overall mechanical strength of the vapor chamber by welding the reinforcing rib for the vapor chamber, so that the vapor chamber has a heat dissipation effect and a high mechanical strength at the same time. The vapor chamber can have a supporting effect when electronic components are mounted, thus being multi-functional. Therefore, the vapor chamber manufactured by the manufacturing method for a vapor chamber in the disclosure has a good anti-aging performance and a very good mechanical strength, and can have a supporting effect on electronic components, thus being multi-functional.

According to some embodiments of the disclosure, preparing different raw materials for various parts of the vapor chamber, and machining and molding the various parts according to predetermined shapes of the various parts by using corresponding raw materials, includes:
according to a predetermined shape of an upper cover of the vapor chamber, punching or etching a stainless steel sheet to obtain the upper cover;
according to a predetermined shape of a lower cover of the vapor chamber, punching or etching the stainless steel sheet to obtain the lower cover; and
according to a predetermined shape of a liquid suction core of the vapor chamber, cutting a copper mesh by laser to obtain the liquid suction core.

According to some embodiments of the disclosure, assembling the machined and molded various parts of the vapor chamber, and welding and sealing the assembled various parts of the vapor chamber, includes:
placing the liquid suction core in the lower cover, and fixing the liquid suction core on the lower cover through high-temperature sintering or electric resistance welding; and
placing the upper cover on the lower cover fixed with the liquid suction core, and sealing the liquid suction core in a cavity formed by the upper cover and the lower cover through braze welding, fusion welding or pressure welding.

According to some embodiments of the disclosure, performing a surface heat treatment on the vapor chamber after welding and sealing, includes:
placing the vapor chamber after welding and sealing in an oven, keeping a temperature of the oven between 100° C. and 400° C., and baking the vapor chamber for 1 hour to 5 hours.

According to some embodiments of the disclosure, performing a passivating treatment on the vapor chamber subjected to the surface heat treatment, includes:
placing the vapor chamber subjected to the surface heat treatment in a hydrogen furnace, keeping a temperature of the hydrogen furnace between 500° C. and 950° C., turning off the hydrogen furnace after heating for 1 hour to 6 hours, and cooling the vapor chamber along with the hydrogen furnace to normal temperature.

According to some embodiments of the disclosure, assembling the vapor chamber subjected to the passivating treatment with a liquid injection pipe, includes:

performing an annealing treatment on the liquid injection pipe; and inserting the liquid injection pipe subjected to the annealing treatment into a water injection port of the vapor chamber to be fixed by welding.

A vapor chamber is provided according to an embodiment in a second aspect of the disclosure, which is manufactured by the above-mentioned manufacturing method for a vapor chamber.

The vapor chamber according to an embodiment of the disclosure has at least the following beneficial effects. The vapor chamber has a good anti-aging performance and a high mechanical strength, and can have a supporting effect on electronic components.

According to some embodiments of the disclosure, a surface of one side of the upper cover close to the liquid suction core is provided with a plurality of reinforcing ribs, the reinforcing ribs abut against a surface of one side of the lower cover close to the liquid suction core, and the reinforcing ribs are welded with the lower cover.

According to some embodiments of the disclosure, a surface of one side of the lower cover far away from the liquid suction core is provided with a plurality of welding points, a position of each of the welding points faces directly one of the reinforcing ribs inside the vapor chamber, and the reinforcing ribs are welded with the lower cover through the welding points.

A middle frame vapor chamber is provided according to an embodiment in a third aspect of the disclosure, which includes:

a middle frame, wherein the middle frame is provided with an opening; and the above-mentioned vapor chamber, wherein the vapor chamber is located in the opening and welded with the middle frame.

The middle frame vapor chamber according to an embodiment of the disclosure has at least the following beneficial effects. The vapor chamber and the middle frame are connected into a whole by welding the vapor chamber with the middle frame, which enhances a mechanical strength of the middle frame vapor chamber, thus reducing a thickness of the middle frame vapor chamber on the premise of achieving the same effect, and realizing large-area heat dissipation.

Additional aspects and advantages of the disclosure will be given in part in the following description, which will become apparent from the following description or be understood through practice of the disclosure.

BRIEF DESCRIPTION OF THE DRAWINGS

The disclosure is further described hereinafter with reference to the drawings and the embodiments, wherein.

REFERENCE NUMERALS

Figure 1:
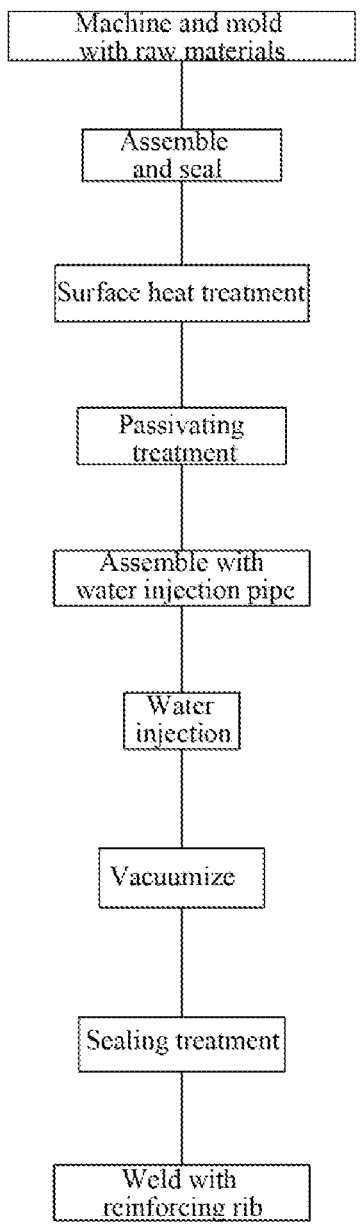
FIG. 1 is a flow chart of a manufacturing method for a vapor chamber according to an embodiment of the disclosure.

100 refers to vapor chamber, 110 refers to upper cover, 111 refers to reinforcing rib, 120 refers to liquid suction core, 130 refers to lower cover, 131 refers to welding point, 200 refers to middle frame, and 210 refers to opening.

DETAILED DESCRIPTION

Embodiments of the disclosure are described in detail hereinafter, examples of the embodiments are shown in the drawings, and the same or similar reference numerals throughout the drawings denote the same or similar elements or elements having the same or similar functions. The embodiments described hereinafter with reference to the drawings are exemplary, are only intended to explain the disclosure, and cannot be understood as limiting the disclosure.

In the description of the disclosure, it should be understood that, the description with reference to the orientation or position relationship, such as the orientation or position relationship indicated by the terms "upper", "lower", "front", "rear", "left", "right", and the like is based on the orientation or position relationship shown in the drawings, which is only used for convenience of the description of the disclosure and simplification of the description instead of indicating or implying that the indicated device or element must have a specific orientation, and be constructed and operated in a specific orientation, and thus should not be understood as a limitation to the disclosure.

In the description of the disclosure, the term "several" refers to being one or more, the term "multiple" refers to being two or more, and the terms "greater than", "less than", "more than" and the like are understood as not including the following number, while the terms "above", "below", "within" and the like are understood as including the following number. If there is the description of first and second, it is only for the purpose of distinguishing between technical features, and should not be understood as indicating or implying relative importance, implicitly indicating the number of the indicated technical features or implicitly indicating the order of the indicated technical features.

In the description of the disclosure, unless otherwise explicitly defined, the terms "setting", "mounting" and "connecting" should be understood in a broad sense, and those of ordinary skills in the art can reasonably determine the specific meanings of the above terms in the disclosure in combination with the specific contents of the technical solution.

In the description of the disclosure, the descriptions with reference to the terms "one embodiment", "some embodiments", "schematic embodiments", "examples", "specific examples", or "some examples" refer to that the specific features, structures, materials, or characteristics described in combination with the embodiment or example are included in at least one embodiment or example of the disclosure. In the specification, the schematic representation of the above terms does not necessarily mean the same embodiment or example. Moreover, the specific features, structures, materials or characteristics described may be combined in any one or more embodiments or examples in a suitable manner.

A manufacturing method for a vapor chamber according to an embodiment of the disclosure is described hereinafter with reference to FIG. 1 and FIG. 3.

Figure 3:
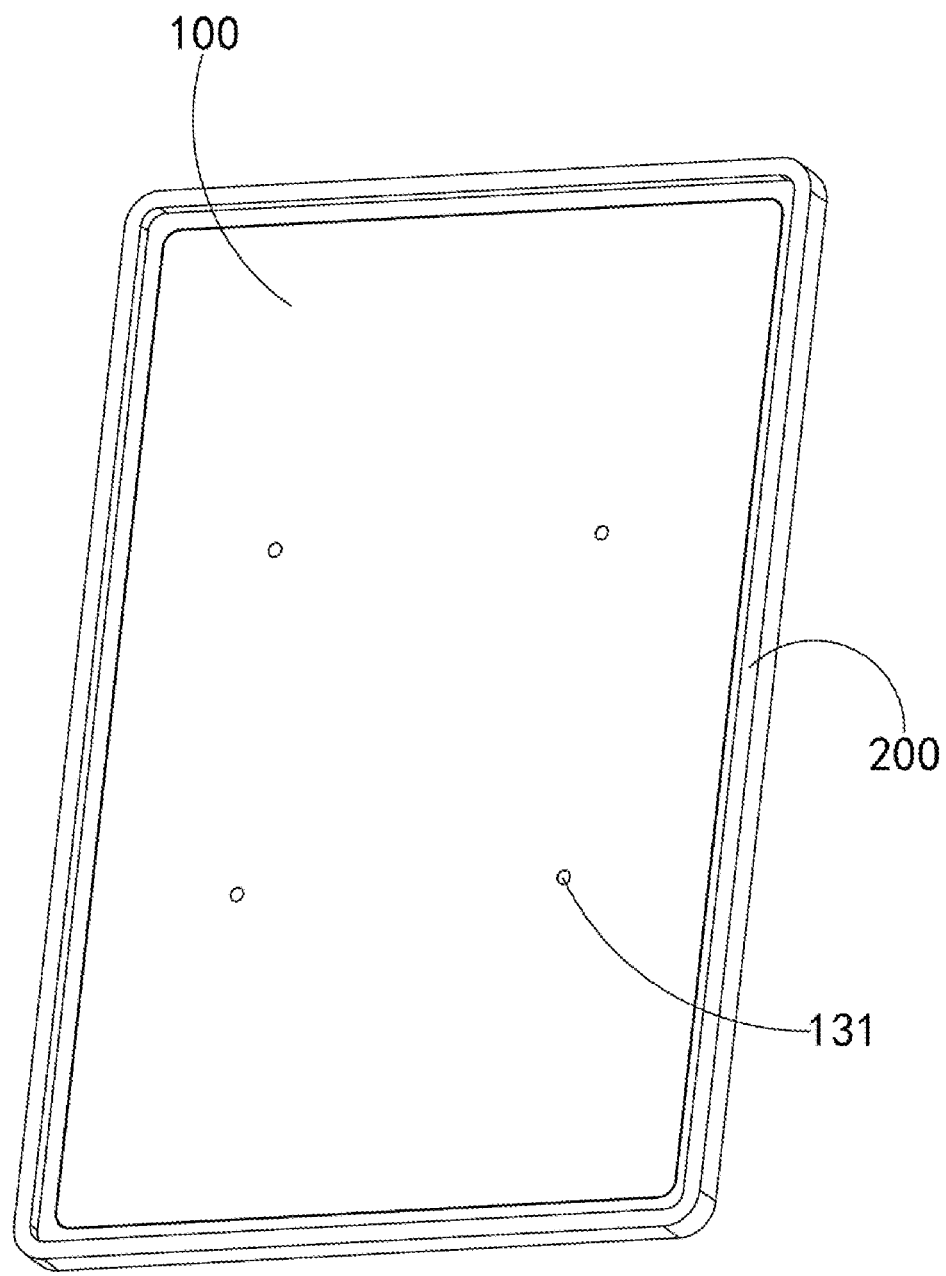
FIG. 3 is a schematic structural diagram of a middle frame vapor chamber according to an embodiment of the disclosure.

As shown in FIG. 1 and FIG. 3, the manufacturing method for a vapor chamber according to an embodiment of the disclosure includes:

preparing different raw materials for various parts of the vapor chamber 100, and machining and molding the various parts according to predetermined shapes of the various parts by using corresponding raw materials;

assembling the machined and molded various parts of the vapor chamber 100, and welding and sealing the assembled various parts of the vapor chamber 100;

performing a surface heat treatment on the vapor chamber 100 after welding and sealing;

performing a passivating treatment on the vapor chamber 100 subjected to the surface heat treatment;

assembling the vapor chamber 100 subjected to the passivating treatment with a liquid injection pipe;

injecting water into the vapor chamber 100 assembled with the liquid injection pipe;

vacuumizing the vapor chamber 100 injected with water;

performing a sealing treatment on the vacuumized vapor chamber 100; and welding the vapor chamber 100 subjected to the sealing treatment with a reinforcing rib 111.

In related arts, a mobile phone is gradually becoming thinner and lighter, leaving less and less assembly space for electronic components. The vapor chamber 100, as a technical solution for heat dissipation of the mobile phone, has been widely applied.

The vapor chamber 100 does not react with water by the surface heat treatment on the vapor chamber 100, so that the anti-aging performance of the vapor chamber is effectively improved, and the reliability of the vapor chamber 100 is ensured. In addition, an overall mechanical strength of the vapor chamber 100 is enhanced by welding the reinforcing rib 111 for the vapor chamber 100, so that the vapor chamber 100 has a heat dissipation effect and a high mechanical strength at the same time. The vapor chamber 100 can have a supporting effect when electronic components are mounted, thus being multi-functional. Therefore, the manufacturing method for a vapor chamber 100 in the disclosure has a good anti-aging performance and a very good mechanical strength. In addition to realizing heat dissipation of electronic components, the vapor chamber can also be used as a support for mounting electronic components, thus being multi-functional.

It can be understood that, as shown in FIG. 1, preparing different raw materials for various parts of the vapor chamber 100, and machining and molding the various parts according to predetermined shapes of the various parts by using corresponding raw materials, includes:

according to a predetermined shape of an upper cover 110 of the vapor chamber 100, punching or etching a stainless steel sheet to obtain the upper cover 110;

according to a predetermined shape of a lower cover 130 of the vapor chamber 100, punching or etching the stainless steel sheet to obtain the lower cover 130; and according to a predetermined shape of a liquid suction core 120 of the vapor chamber 100, cutting a copper mesh by laser to obtain the liquid suction core 120.

Figure 2:
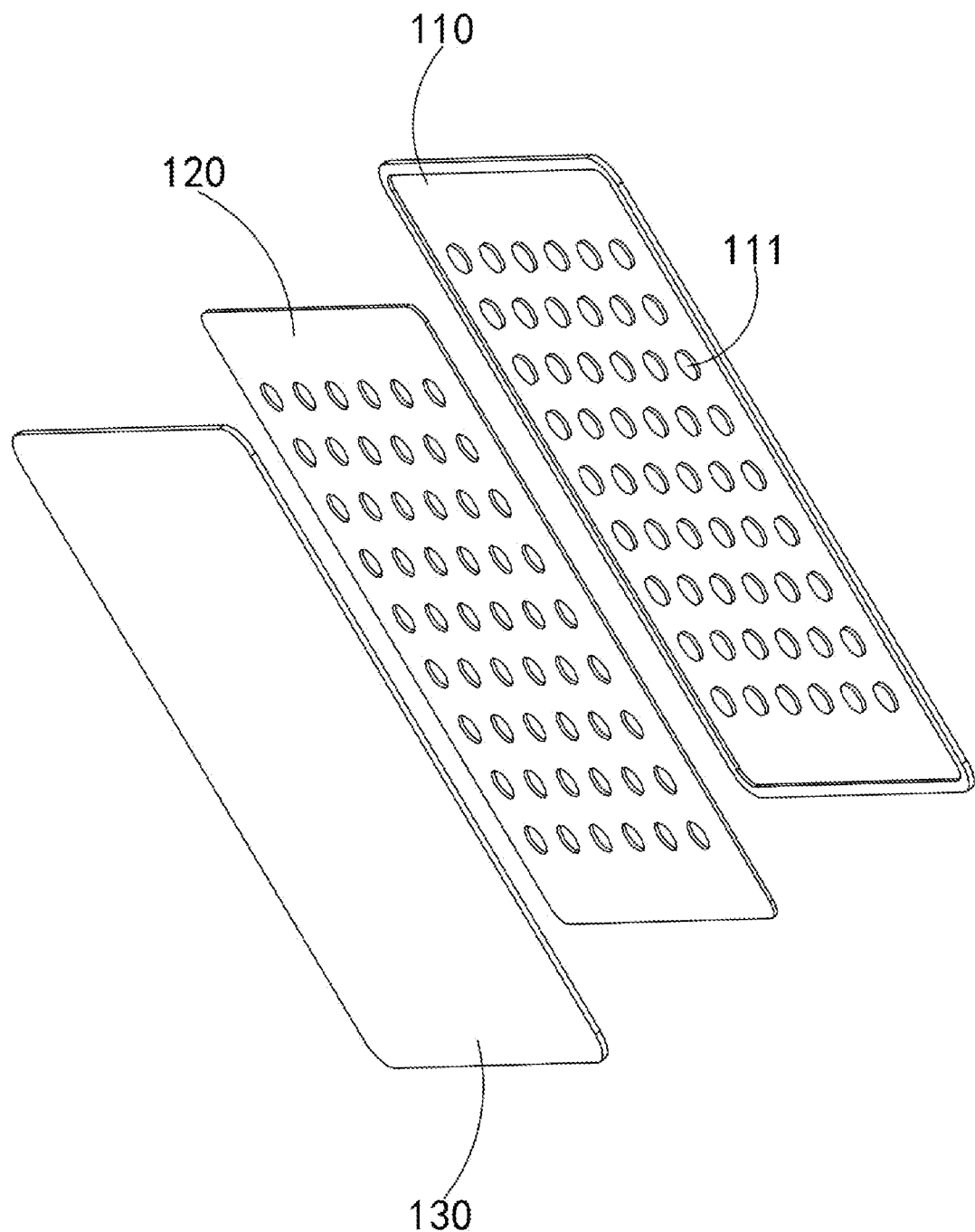
FIG. 2 is a schematic diagram of an exploded structure of the vapor chamber according to an embodiment of the disclosure.

Specifically, as shown in FIG. 2, the vapor chamber 100 includes an upper cover 110, a liquid suction core 120 and a lower cover 130. The upper cover 110 and the lower cover 130 are both made of a stainless steel sheet, so that the vapor chamber 100 can have a better mechanical strength. Specifically, the liquid suction core 120 is a porous copper mesh.

Specifically, as shown in FIG. 2, the predetermined shapes of the various parts include the following predetermined shapes: the upper cover 110 of the vapor chamber is in a rectangle shape, the liquid suction core 120 is in a rectangle shape with a plurality of through holes, the lower cover 130 is provided with a plurality of bumps matched with the through holes of the liquid suction core 120, and the lower cover 130 is in a rectangle shape.

It can be understood that, as shown in FIG. 1, the vapor chamber 100 further includes a working medium. The vapor chamber 100 assembled with the liquid injection pipe is injected with water, and the water is used as the working medium. Further, the vapor chamber 100 may also be injected with ethanol as the working medium.

It can be understood that, as shown in FIG. 1, the vapor chamber 100 injected with water is vacuumized. In order to make the vapor chamber 100 injected with water have a better heat dissipation effect, the vapor chamber is usually vacuumized by vacuumizing equipment.

It can be understood that, as shown in FIG. 1, performing a sealing treatment on the vacuumized vapor chamber 100, includes:

heating the vapor chamber 100, and discharging gas in the vapor chamber through the liquid injection pipe; and sequentially sealing and cutting the liquid injection pipe.

Further, the sealing treatment above is performed by a secondary degasser. The sealing treatment can effectively remove waste gas in the vapor chamber, and effectively seal the liquid injection pipe, thus improving the heat dissipation effect of the vapor chamber.

It can be understood that, as shown in FIG. 1, welding the vapor chamber 100 subjected to the sealing treatment with a reinforcing rib 111, includes:

determining welding points 131 of a plurality of reinforcing ribs 111; and welding a convex portion of the upper cover 110 on the lower cover 130 by laser welding through the welding points 131.

The welding of the reinforcing ribs 111 can effectively enhance the mechanical strength of the vapor chamber.

It can be understood that, as shown in FIG. 1, assembling the machined and molded various parts of the vapor chamber 100, and welding and sealing the assembled various parts of the vapor chamber 100, includes:

placing the liquid suction core 120 in the lower cover 130, and fixing the liquid suction core 120 on the lower cover 130 through high-temperature sintering or electric resistance welding; and placing the upper cover 110 on the lower cover 130 fixed with the liquid suction core 120, and sealing the liquid suction core 120 in a cavity formed by the upper cover 110 and the lower cover 130 through braze welding, fusion welding or pressure welding.

Specifically, the braze welding may be high temperature braze welding, the fusion welding may be laser welding, and the pressure welding may be diffusion welding. By adopting the above welding methods, a better welding effect and a good sealing effect can be achieved.

It can be understood that, as shown in FIG. 1, performing a surface heat treatment on the vapor chamber 100 after welding and sealing, includes:

placing the vapor chamber 100 after welding and sealing in an oven, keeping a temperature of the oven between 100° C. and 400° C., and baking the vapor chamber for 1 hour to 5 hours.

The surface heat treatment can make the vapor chamber 100 have a very good anti-aging performance.

It can be understood that, as shown in FIG. 1, performing a passivating treatment on the vapor chamber 100 subjected to the surface heat treatment, includes:

placing the vapor chamber 100 subjected to the surface heat treatment in a hydrogen furnace, keeping a temperature of the hydrogen furnace between 500° C. and 950° C., turning off the hydrogen furnace after heating for 1 hour to 6 hours, and cooling the vapor chamber 100 along with the hydrogen furnace to normal temperature.

The passivating treatment can make the vapor chamber 100 have a good anti-corrosion performance.

It can be understood that, as shown in FIG. 1, assembling the vapor chamber 100 subjected to the passivating treatment with a liquid injection pipe, includes:

performing an annealing treatment on the liquid injection pipe; and inserting the liquid injection pipe subjected to the annealing treatment into a water injection port of the vapor chamber 100 to be fixed by welding.

Specifically, the annealing treatment is performed on the liquid injection pipe at an annealing temperature of 400° C. to 800° C., and after heat preservation for 1 hour to 3 hours, the liquid injection pipe is cooled to room temperature along with the furnace, thus being simple to operate, and providing conditions for subsequent processes.

The vapor chamber 100 according to an embodiment of the disclosure is described hereinafter with reference to FIG. 2.

As shown in FIG. 2, the vapor chamber 100 according to an embodiment of the disclosure is manufactured by the manufacturing method for a vapor chamber 100 above.

After the process treatments above, the vapor chamber 100 has a good anti-aging performance, a certain anti-corrosion performance and a high mechanical strength, and can have a supporting effect on electronic components.

It can be understood that, as shown in FIG. 2 and FIG. 3, a surface of one side of the upper cover 110 close to the liquid suction core 120 is provided with a plurality of reinforcing ribs 111, the reinforcing ribs 111 abut against a surface of one side of the lower cover 130 close to the liquid suction core 120, and the reinforcing ribs 111 are welded with the lower cover 130.

The welding of the reinforcing ribs 111 effectively enhances the mechanical strength of the vapor chamber, so that the vapor chamber 100 can also be used as a support for mounting electronic components while having a heat dissipation effect, thus being multi-functional.

It can be understood that, as shown in FIG. 2 and FIG. 3, a surface of one side of the lower cover 130 far away from the liquid suction core 120 is provided with a plurality of welding points 131, a position of each of the welding points 131 faces directly one of the reinforcing ribs 111 inside the vapor chamber 100, and the reinforcing ribs 111 are welded with the lower cover 130 through the welding points 131.

Specifically, the reinforcing ribs 111 are welded by laser welding, with 4 welding points 131, and connecting lines of the welding points 131 form a square, which is more conducive to uniform stress.

A middle frame vapor chamber according to an embodiment of the disclosure is described hereinafter with reference to FIG. 3 and FIG. 4.

Figure 4:
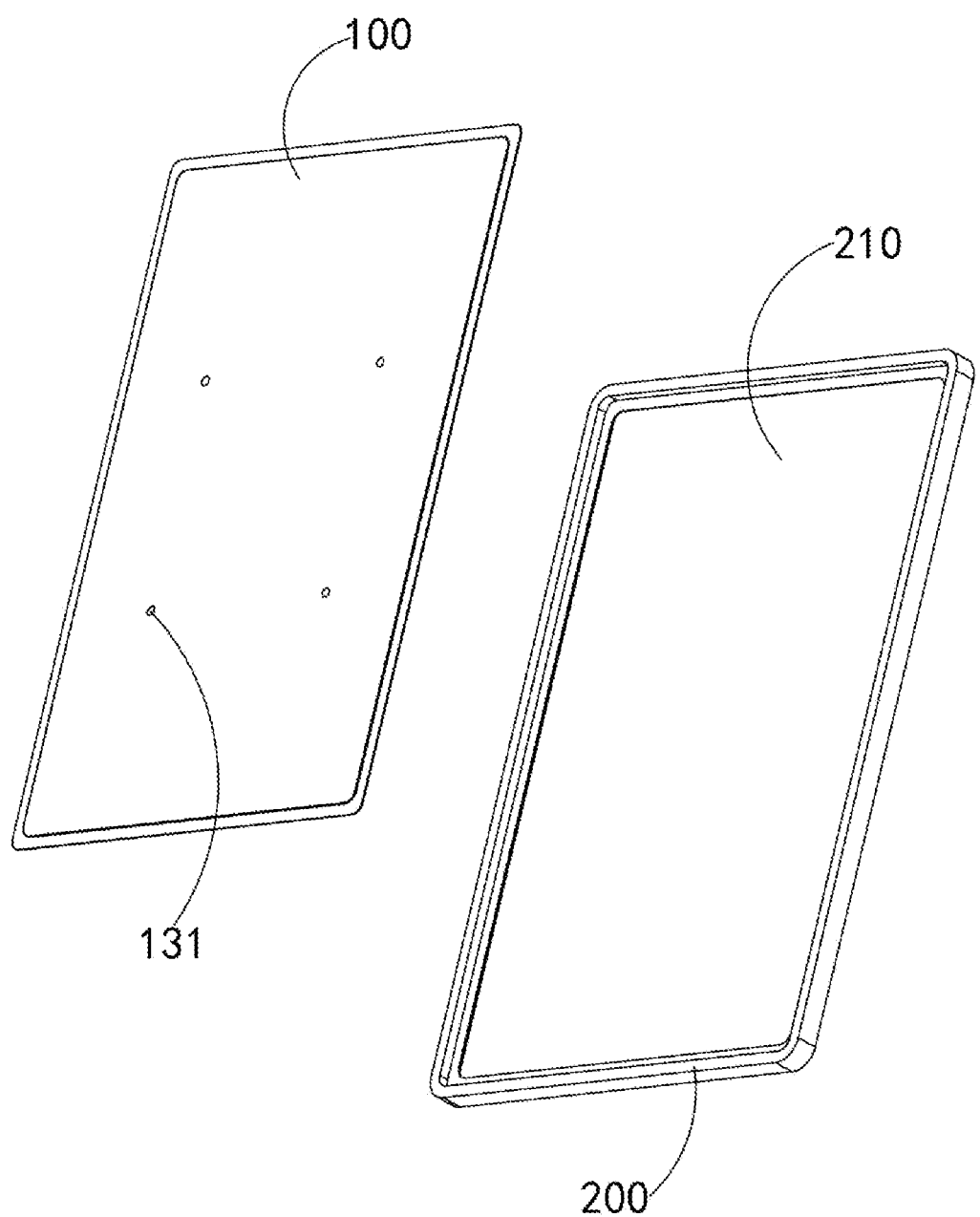
FIG. 4 is a schematic diagram of an exploded structure of the middle frame vapor chamber according to an embodiment of the disclosure.

As shown in FIG. 3 and FIG. 4, the middle frame vapor chamber according to an embodiment of the disclosure includes:

a middle frame 200, wherein the middle frame 200 is provided with an opening 210; and the above-mentioned vapor chamber 100, wherein the vapor chamber 100 is located in the opening 210 and welded with the middle frame 200.

The vapor chamber 100 and the middle frame 200 are connected into a whole by welding the vapor chamber 100 with the middle frame 200, which enhances a mechanical strength of the middle frame 200 vapor chamber 100, thus reducing a thickness of the middle frame 200 vapor chamber on the premise of achieving the same effect, and realizing large-area heat dissipation.

Specifically, the vapor chamber 100 and the middle frame 200 may be connected by laser welding, riveting or cementing.

The embodiments of the disclosure are described in detail with reference to the drawings above, but the disclosure is not limited to the above embodiments, and various changes may also be made within the knowledge scope of those of ordinary skills in the art without departing from the purpose of the disclosure. In addition, the embodiments of the disclosure and the features in the embodiments may be combined with each other without conflict.

What is claimed is:

1. A manufacturing method for a vapor chamber, comprising:

preparing different raw materials for various parts of the vapor chamber, and machining and molding the various parts according to predetermined shapes of the various parts by using corresponding raw materials;

assembling the machined and molded various parts of the vapor chamber, and welding and sealing the assembled various parts of the vapor chamber;

performing a surface heat treatment on the vapor chamber after welding and sealing;

performing a passivating treatment on the vapor chamber subjected to the surface heat treatment;

assembling the vapor chamber subjected to the passivating treatment with a liquid injection pipe;

injecting water into the vapor chamber assembled with the liquid injection pipe;

vacuumizing the vapor chamber injected with water;

performing a sealing treatment on the vacuumized vapor chamber;

welding the vapor chamber subjected to the sealing treatment with a reinforcing rib;

wherein performing a passivating treatment on the vapor chamber subjected to the surface heat treatment, comprises:

placing the vapor chamber subjected to the surface heat treatment in a hydrogen furnace, keeping a temperature of the hydrogen furnace between 500° C. and 950° C., turning off the hydrogen furnace after heating for 1 hour to 6 hours, and cooling the vapor chamber along with the hydrogen furnace to normal temperature;

wherein assembling the vapor chamber subjected to the passivating treatment with a liquid injection pipe, comprises:

performing an annealing treatment on the liquid injection pipe; and inserting the liquid injection pipe subjected to the annealing treatment into a water injection port of the vapor chamber to be fixed by welding;

wherein performing a sealing treatment on the vacuumized vapor chamber, comprises:

heating the vapor chamber, and discharging gas in the vapor chamber through the liquid injection pipe; and sequentially sealing and cutting the liquid injection pipe;
wherein performing a surface heat treatment on the vapor chamber after welding and sealing, comprises:
placing the vapor chamber after welding and sealing in an oven, keeping a temperature of the oven between 100° C. and 400° C., and baking the vapor chamber for 1 hour to 5 hours.

2. The manufacturing method for a vapor chamber according to claim 1, wherein preparing different raw materials for various parts of the vapor chamber, and machining and molding the various parts according to predetermined shapes of the various parts by using corresponding raw materials, comprises:
according to a predetermined shape of an upper cover of the vapor chamber, punching or etching a stainless steel sheet to obtain the upper cover;
according to a predetermined shape of a lower cover of the vapor chamber, punching or etching the stainless steel sheet to obtain the lower cover; and
according to a predetermined shape of a liquid suction core of the vapor chamber, cutting a copper mesh by laser to obtain the liquid suction core.

3. The manufacturing method for a vapor chamber according to claim 2, wherein assembling the machined and molded various parts of the vapor chamber, and welding and sealing the assembled various parts of the vapor chamber, comprises:
placing the liquid suction core in the lower cover, and fixing the liquid suction core on the lower cover through electric resistance welding; and
placing the upper cover on the lower cover fixed with the liquid suction core, and sealing the liquid suction core in a cavity formed by the upper cover and the lower cover through braze welding, fusion welding or pressure welding.

* * * * *